(12) United States Patent
Wang et al.

(10) Patent No.: US 10,064,307 B2
(45) Date of Patent: Aug. 28, 2018

(54) SERVER AND CASE THEREOF

(71) Applicant: Wistron Corp., New Taipei (TW)

(72) Inventors: Jun-Hao Wang, New Taipei (TW);
Chen-Yu Li, New Taipei (TW);
Zhi-Ming Guo, New Taipei (TW);
Chong-Xing Zhu, New Taipei (TW)

(73) Assignee: WISTRON CORP, New Taipei (TW)

( * ) Notice: Subject to any disclaimer, the term of this patent is extended or adjusted under 35 U.S.C. 154(b) by 127 days.

(21) Appl. No.: 15/151,264

(22) Filed: May 10, 2016

(65) Prior Publication Data

US 2017/0251566 A1   Aug. 31, 2017

(30) Foreign Application Priority Data

Feb. 25, 2016 (CN) .......................... 2016 1 0104873

(51) Int. Cl.
*H05K 7/14* (2006.01)
*H05K 7/20* (2006.01)

(52) U.S. Cl.
CPC ....... *H05K 7/1489* (2013.01); *H05K 7/20709* (2013.01); *H05K 7/20727* (2013.01)

(58) Field of Classification Search
CPC ...................................... H05K 7/1487–7/1489
See application file for complete search history.

(56) References Cited

U.S. PATENT DOCUMENTS

| | | | | |
|---|---|---|---|---|
| 5,287,974 A * | 2/1994 | Buday | .................... | A47B 57/58 211/175 |
| 6,549,422 B1 * | 4/2003 | Mendoza | ............. | H05K 7/1418 220/62.22 |
| 6,552,915 B2 * | 4/2003 | Takahashi | ............ | H05K 7/1418 361/752 |
| 7,214,088 B1 * | 5/2007 | Liang | ...................... | G06F 1/188 361/679.55 |
| 7,558,074 B2 * | 7/2009 | Liang | ...................... | G06F 1/183 174/50 |
| 7,654,844 B1 * | 2/2010 | Wormsbecher | .. | H01R 13/62938 361/727 |
| 7,738,262 B2 * | 6/2010 | Sato | ...................... | H05K 9/0007 361/800 |
| 7,889,508 B2 * | 2/2011 | Sato | ...................... | H05K 7/1461 361/741 |
| 8,054,632 B2 * | 11/2011 | Regimbal | ............... | G06F 1/181 312/223.1 |
| 8,670,241 B2 * | 3/2014 | Sherrod | ............... | H05K 7/1488 361/725 |

(Continued)

*Primary Examiner* — Zachary M Pape
(74) *Attorney, Agent, or Firm* — Nixon Peabody LLP

(57) ABSTRACT

A server includes a case and function modules. The case includes a frame, a first upright partition and a second upright partition. The frame has an internal space and an opening. The opening corresponds to the internal space. The first upright partition and the second upright partition jointly define a first accommodating portion, a second accommodating portion and a third accommodating portion in the internal space. Each of the function modules is a first function module, a second function module or a third function module. A width of the first function module is half of the width of the second accommodating portion. The width of the first function module, a width of the second function module and a width of the third function module have a ratio of 1:2:4.

21 Claims, 14 Drawing Sheets

(56) References Cited

U.S. PATENT DOCUMENTS

| | | | | |
|---|---|---|---|---|
| 8,797,736 B2* | 8/2014 | Zhu | .................... | G06F 1/187 |
| | | | | 174/535 |
| 8,861,186 B2* | 10/2014 | Chuang | .................... | G06F 1/26 |
| | | | | 248/311.2 |
| 9,167,716 B2* | 10/2015 | Ma | .................... | H05K 7/1489 |
| 2012/0039036 A1* | 2/2012 | Krause | .................... | F28D 15/00 |
| | | | | 361/679.47 |
| 2013/0009529 A1* | 1/2013 | Zhu | .................... | G06F 1/187 |
| | | | | 312/223.2 |
| 2015/0009639 A1* | 1/2015 | Papakos | .................... | H05K 7/1424 |
| | | | | 361/752 |
| 2017/0127550 A1* | 5/2017 | Heinrichs | .................... | H05K 7/1489 |
| 2017/0339799 A1* | 11/2017 | Su | .................... | H05K 7/1489 |

* cited by examiner

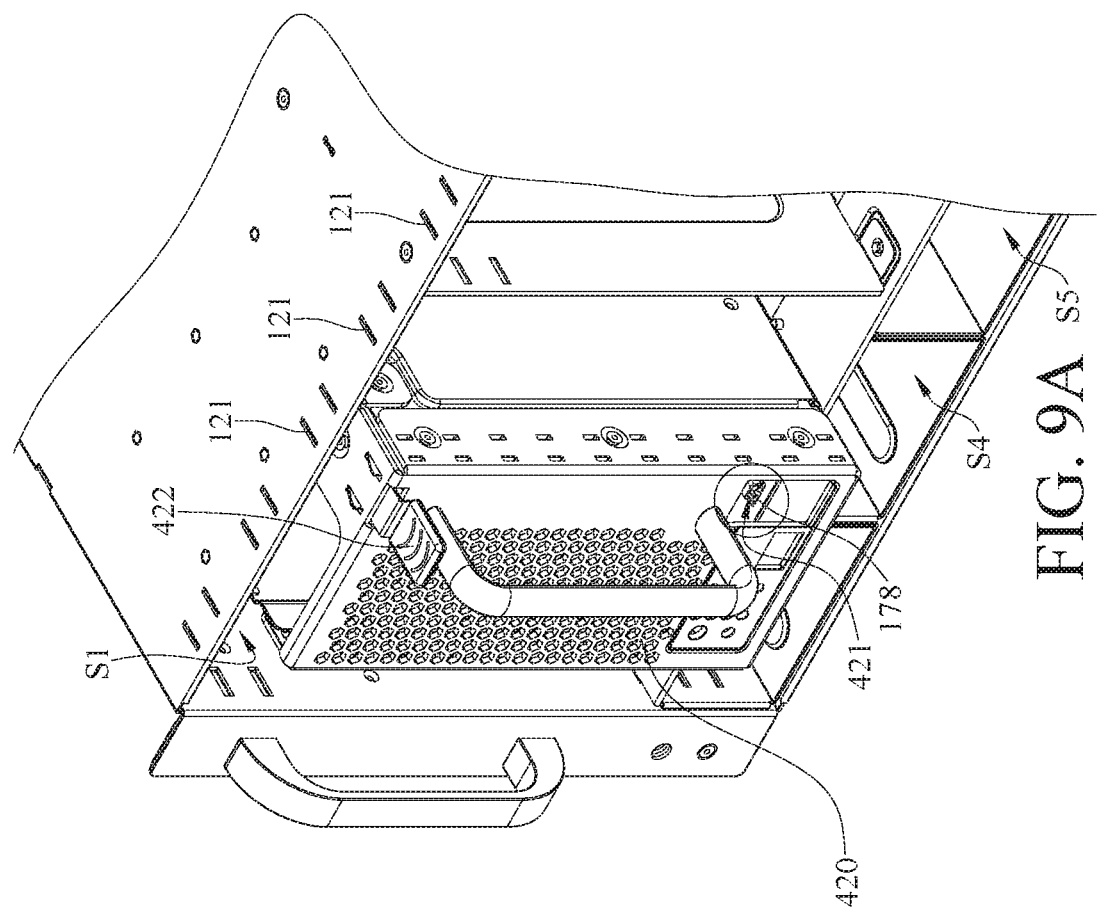

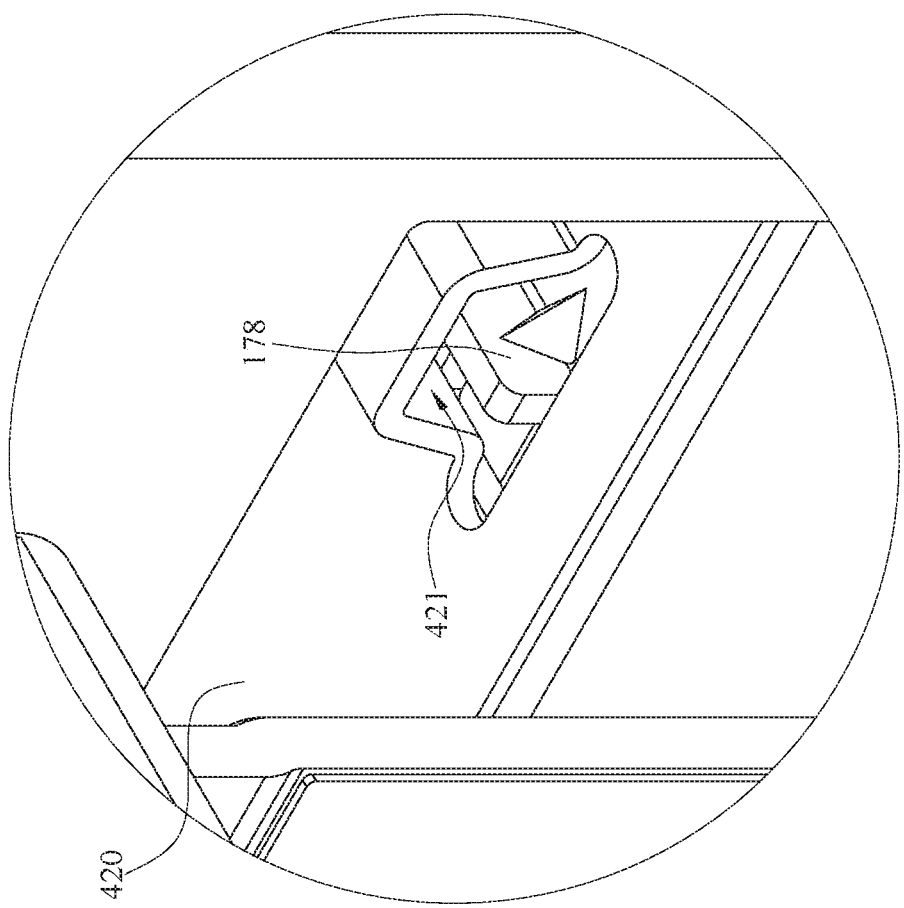

US 10,064,307 B2

SERVER AND CASE THEREOF

CROSS-REFERENCE TO RELATED APPLICATIONS

This non-provisional application claims priority under 35 U.S.C. § 119(a) on Patent Application No(s). 201610104873.6 filed in China on Feb. 25, 2016, the entire contents of which are hereby incorporated by reference.

TECHNICAL FIELD

The disclosure relates to a case and a server having the case, more particularly to a case and a server having the case, which are flexible to accommodate various arrangements of function modules.

BACKGROUND

With the development of technology, person computers such as desk top computers and note computers are widely used in daily life. In addition, with the rapid development of electronic communication, international e-commerce has experienced steady growth for quite a number of years and becomes a trend in today's business world. The person computers no longer meet requirements of e-commerce companies. Accordingly, developers develop various types of servers, such as rack servers, blade servers and upright servers for helping e-commerce companies to deal with e-commerce issues.

SUMMARY

The present disclosure provides a case and a server having the case for reducing the cost of developing a new server.

One embodiment of the disclosure provides a server including a case and function modules. The case includes a frame, a first upright partition and a second upright partition. The frame has an internal space and an opening. The opening corresponds to the internal space. The first upright partition and the second upright partition jointly define a first accommodating portion, a second accommodating portion and a third accommodating portion in the internal space. The first accommodating portion, the second accommodating portion and the third accommodating portion correspond to the opening. The second accommodating portion is located between the first accommodating portion and the third accommodating portion. Each of a width of the first accommodating portion and a width of the third accommodating portion is substantially twice as great as a width of the second accommodating portion. The function modules are respectively detachably accommodated in the first accommodating portion, the second accommodating portion and the third accommodating portion. Each of the function modules is a first function module, a second function module or a third function module. A width of the first function module is substantially half of the width of the second accommodating portion. The width of the first function module, a width of the second function module and a width of the third function module have a ratio of substantially 1:2:4.

One embodiment of the disclosure provides a case including a frame, a first upright partition and a second upright partition. The frame has an internal space and an opening. The opening corresponds to the internal space. The first upright partition and the second upright partition are located in the internal space. The first upright partition and the second upright partition jointly define a first accommodating portion, a second accommodating portion and a third accommodating portion in the internal space. The first accommodating portion, the second accommodating portion and the third accommodating portion correspond to the opening. The second accommodating portion is located between the first accommodating portion and the third accommodating portion. Each of a width of the first accommodating portion and a width of the third accommodating portion is substantially twice as great as a width of the second accommodating portion.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein:

FIG. 9A is a perspective view of the second function module being placed in the wrong position;
FIG. 9B is an enlarged view of the second function module in FIG. 9A.

DETAILED DESCRIPTION

Figure 1A:
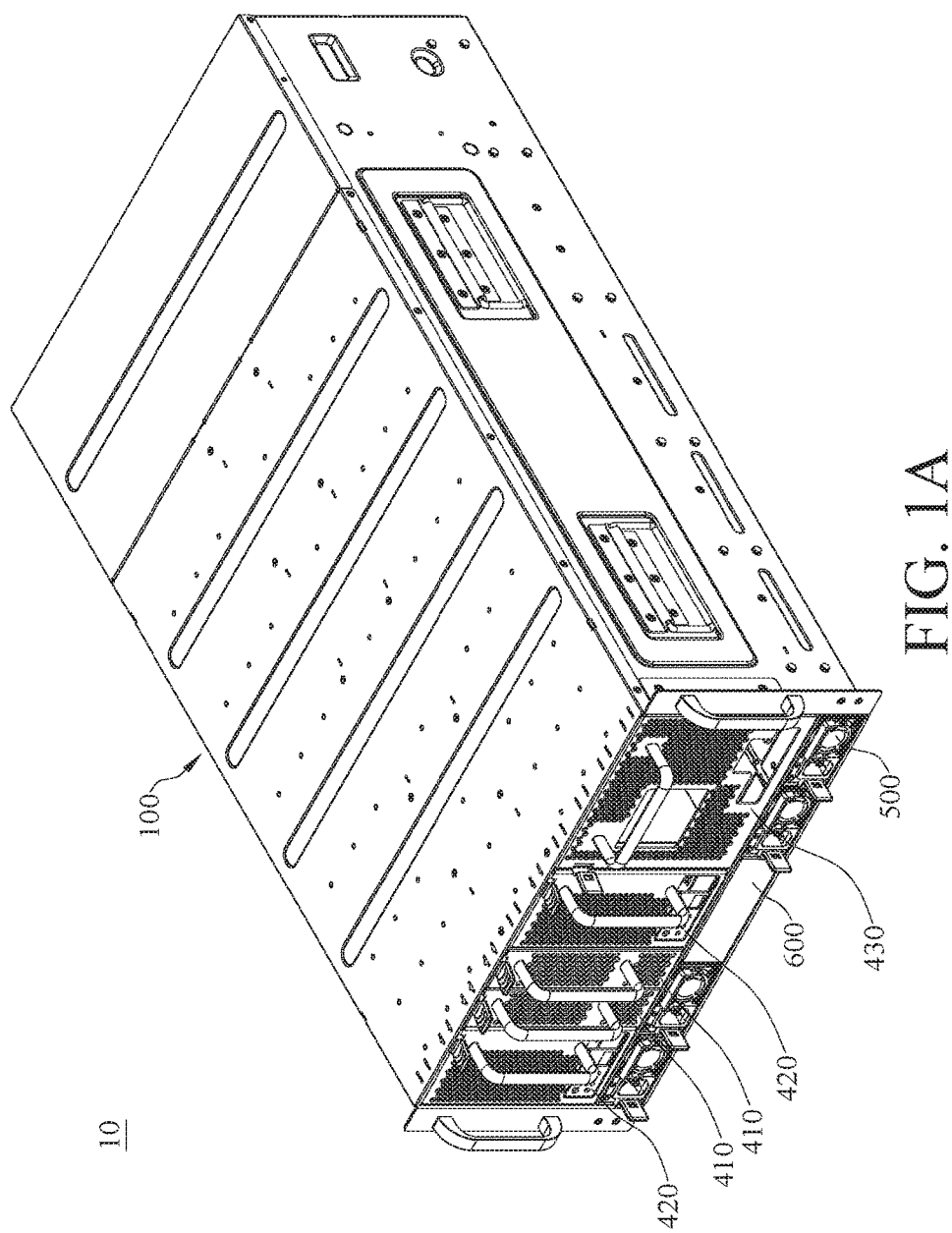
FIG. 1A is a perspective view of a server according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
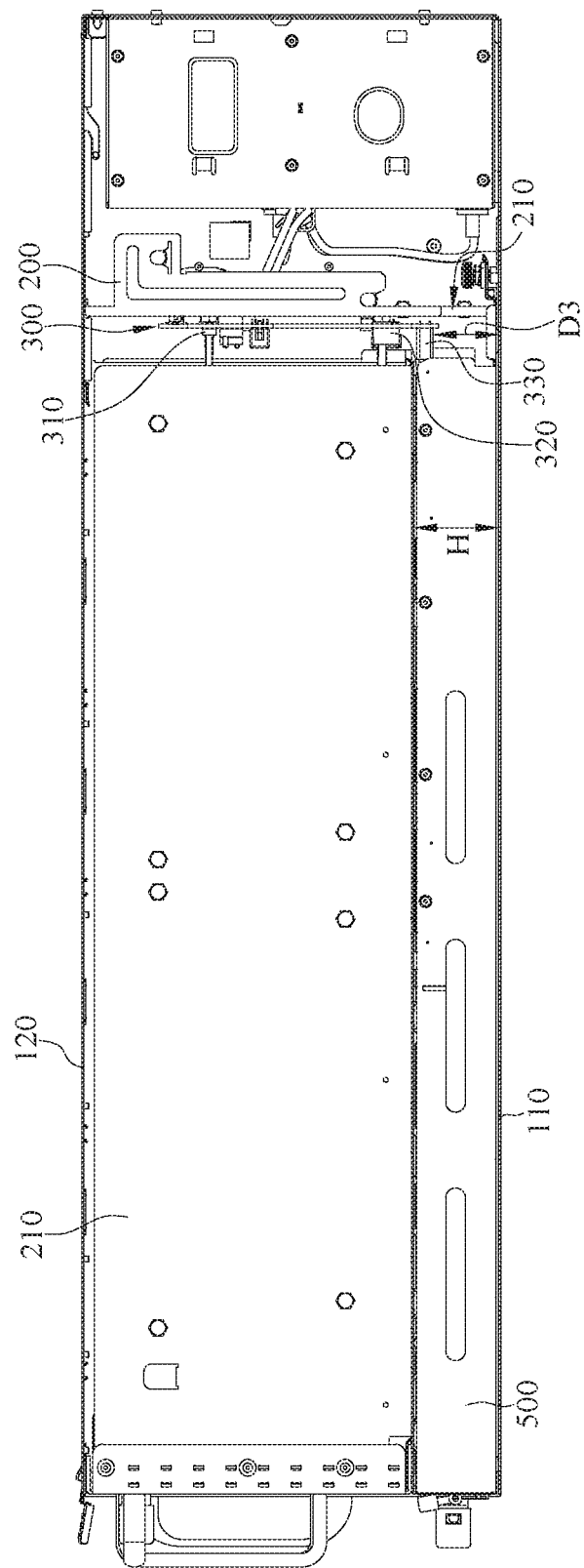
FIG. 1B is a cross-sectional view of the server in FIG. 1A.
Figure 2:
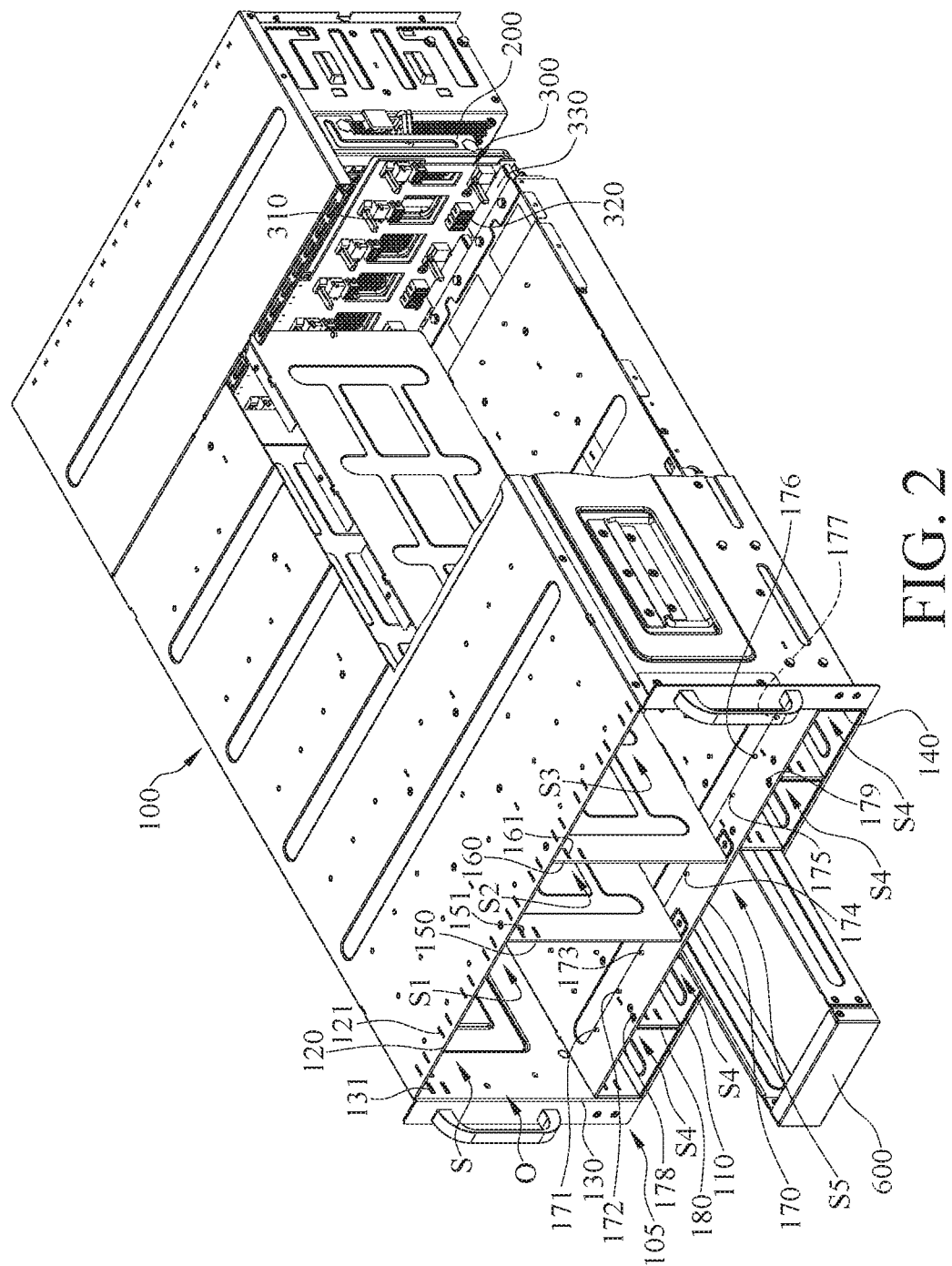
FIG. 2 is a perspective view of a case in FIG. 1A.
Figure 3:
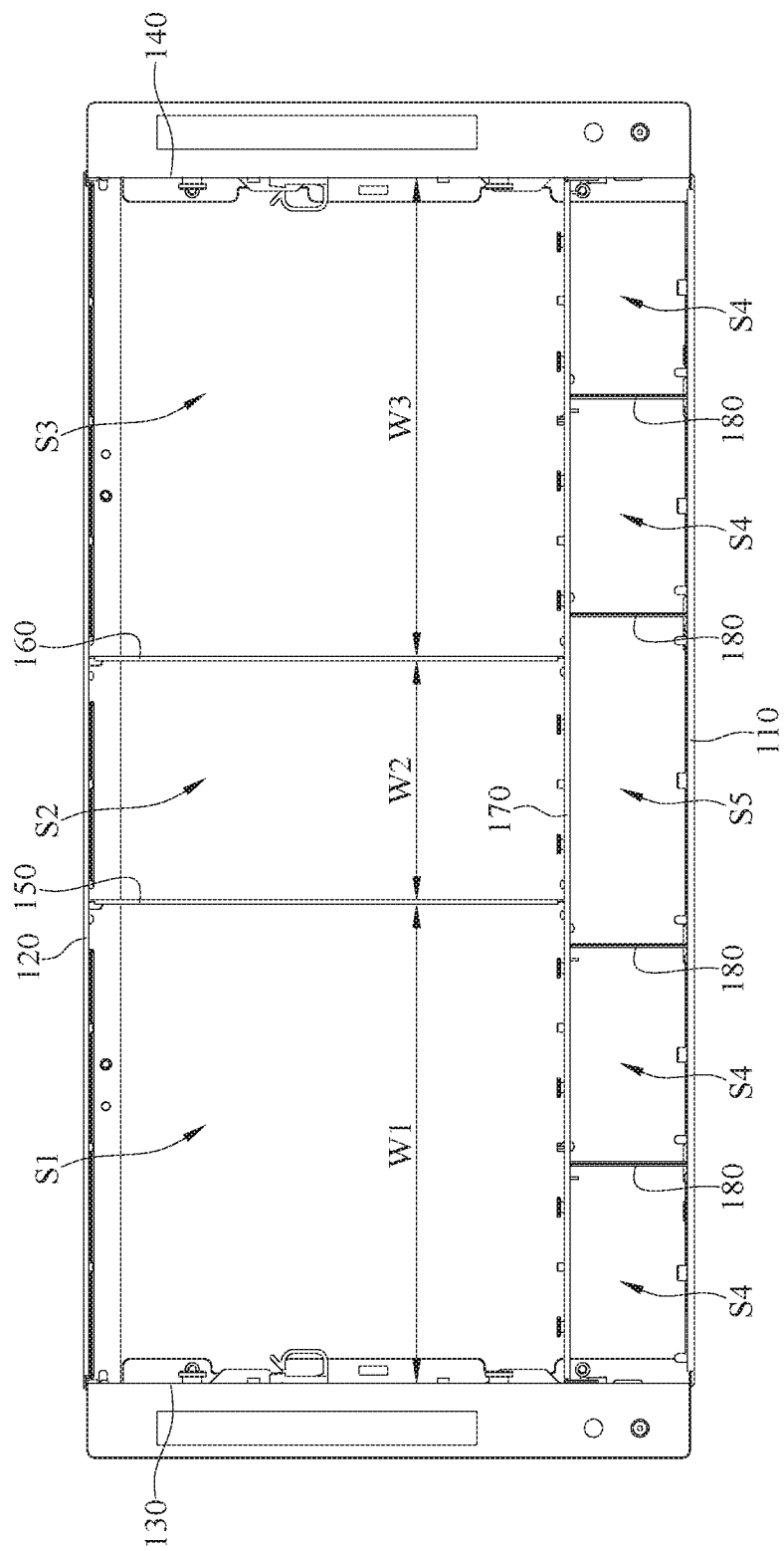
FIG. 3 is a front view of the case in FIG. 1A.

Please refer to FIG. 1 to FIG. 3. FIG. 1A is a perspective view of a server according to a first embodiment of the disclosure, FIG. 1B is a cross-sectional view of the server in FIG. 1A, FIG. 2 is a perspective view of a case in FIG. 1A, and FIG. 3 is a front view of the case in FIG. 1A. As shown in FIG. 1A, a server 10 is provided. The server 10 includes a case 100 and a plurality of function modules.

The case 100 includes a frame 105, a first upright partition 150 and a second upright partition 160. The frame 105 has an internal space S and an opening O. The opening O corresponds to the internal space S. In detail, the frame 105 includes a bottom plate 110, a top plate 120, a first side plate 130 and a second side plate 140. The first side plate 130 and the second side plate 140 are located between the bottom plate 110 and the top plate 120. The first side plate 130 and the second side plate 140 are respectively located on two sides of the bottom plate 110 which are opposite to each other. The bottom plate 110, the top plate 120, the first side plate 130 and the second side plate 140 together define the internal space S.

The first upright partition 150 and the second upright partition 160 are located between the first side plate 130 and the second side plate 140. The first upright partition 150 is closer to the first side plate 130 than the second upright partition 160. In other words, both of the first upright partition 150 and the second upright partition 160 are located in the internal space S.

The first upright partition 150 and the second upright partition 160 jointly define a first accommodating portion S1, a second accommodating portion S2 and a third accommodating portion S3 in the internal space S. The first accommodating portion S1, the second accommodating portion S2 and the third accommodating portion S3 correspond to the opening O. The second accommodating portion S2 is located between the first accommodating portion S1 and the third accommodating portion S3. A width W1 of the first accommodating portion S1 is equal to the distance between the first upright partition 150 and the first side plate 130. A width W2 of the second accommodating portion S2 is equal to the distance between the first upright partition 150 and the second upright partition 160. A width W3 of the third accommodating portion S3 is equal to the distance between the second upright partition 160 and the second side plate 140. In this embodiment, each of the width W1 and the width W3 is substantially twice as great as the width W2.

In this embodiment, the case 100 further includes a separating partition 170 and a plurality of third upright partition 180. Two sides of the separating partition 170 which are opposite to each other are respectively connected to the first side plate 130 and the second side plate 140. The first upright partition 150 and the second upright partition 160 are located between the separating partition 170 and the top plate 120. The third upright partitions 180 are located between the separating partition 170 and the bottom plate 110. The third upright partitions 180 further define a plurality of fourth accommodating portions S4 and a fifth accommodating portion S5 in the internal space S. The fourth accommodating portions S4 and the fifth accommodating portion S5 correspond to the opening O. Each of the fourth accommodating portions S4 is used for accommodating a power supply (not shown). The fifth accommodating portion S5 is a spare for accommodating other requirements.

In this embodiment, the case 100 further includes a first guiding member 171, a second guiding member 172, a third guiding member 173, a fourth guiding member 174, a fifth guiding member 175, a sixth guiding member 176 and a seventh guiding member 177 which all protrude from the separating partition 170 and extend away from the opening O. The first guiding member 171, the second guiding member 172 and the third guiding member 173 are located in the first accommodating portion S1 and sequentially arranged in a direction away from the first side plate 130. The fourth guiding member 174 is located in the second accommodating portion S2. The fifth guiding member 175, the sixth guiding member 176 and the seventh guiding member 177 are located in the third accommodating portion S3 and sequentially arranged in the direction away from the first side plate 130. Each of the guiding members 171 to 177 is, for example, a protrusion, a plurality of rivets or a plurality of protrusions.

In this embodiment, the top plate 120 includes a plurality of slots 121. The first side plate 130 has two slots 131. The first upright partition 150 has two slots 151. The second upright partition 160 has two slots 161. The slots 121 to 161 are used for fixing the function modules. However, the present disclosure is not limited to the quantities of the slots 121 to 161. In other embodiments, the quantity of the slot 121 can be one, the quantity of the slot 131 can be one, and the quantity of the slot 161 can be one.

In this embodiment, the case 100 further includes a first stop protrusion 178 and a second stop protrusion 179. The first stop protrusion 178 is located on an extension line of the second guiding member 172. The first stop protrusion 178 is closer to the opening O than the second guiding member 172. The second stop protrusion 179 is located on an extension line of the sixth guiding member 176. The second stop protrusion 179 is closer to the opening O than the sixth guiding member 176.

Figure 4:
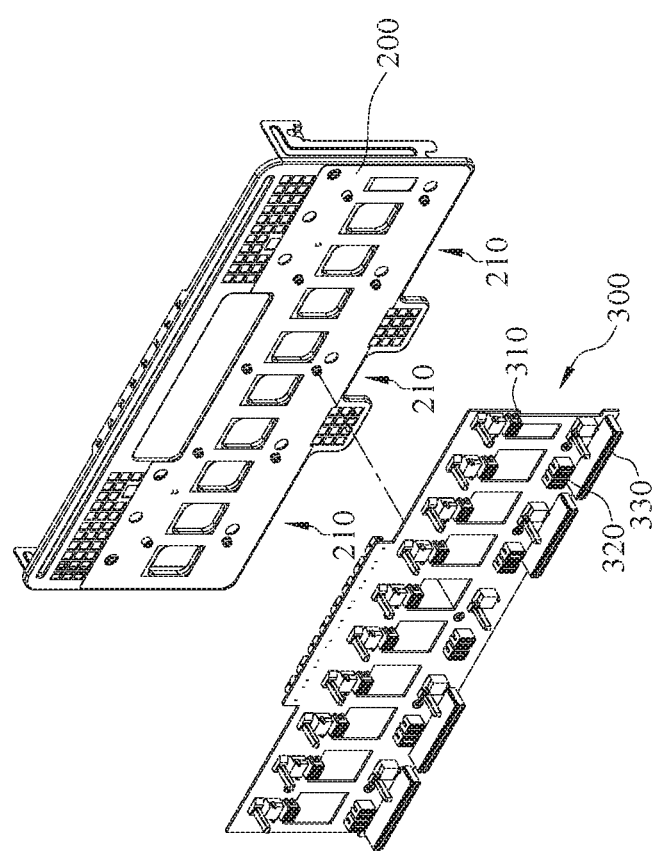
FIG. 4 is an exploded view of a back plate and a circuit board in FIG. 2.
Figure 5:
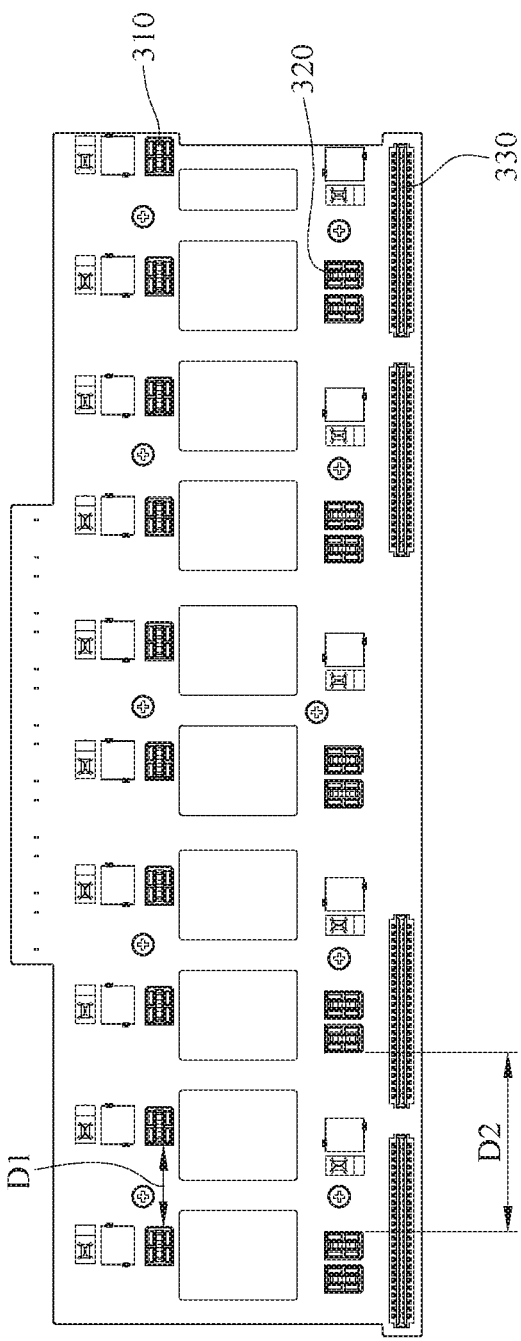
FIG. 5 is a plane view of the circuit board in FIG. 4.

Please refer to FIG. 4 to FIG. 5. FIG. 4 is an exploded view of a back plate and a circuit board in FIG. 2, and FIG. 5 is a plane view of the circuit board in FIG. 4.

In this embodiment, the server 10 further includes a back plate 200 and a circuit board 300. The back plate 200 is uprightly disposed on a side of the bottom plate 110 which is away from the opening O. The back plate 200 is located between the first side plate 130 and the second side plate 140 by, for example, hooking members. In addition, there is a plurality of heat dissipation openings 210 located on a side of the back plate 200 and located close to the bottom plate 110.

The circuit board 300 is mounted to the back plate 200. There are a plurality of first connection ports 310, a plurality of second connection ports 320 and a plurality of first power connection ports 330 which are located on a side of the circuit board 300 which is close to the opening O. The first connection ports 310 are located above the second connection ports 320. The second connection ports 320 are located above the first power connection ports 330. In addition, a distance D2 between two of the second connection ports 320 which are adjacent to each other is twice as great as a distance D1 between two of the first connection ports 310 which are adjacent to each other. A distance D3 between the first power connection ports 330 and the bottom plate 110 is greater than half of a distance H between the bottom plate 110 and the separating partition 170. Furthermore, the heat dissipation openings 210 are located between the first power connection ports 330 and the bottom plate 110.

Figure 6:
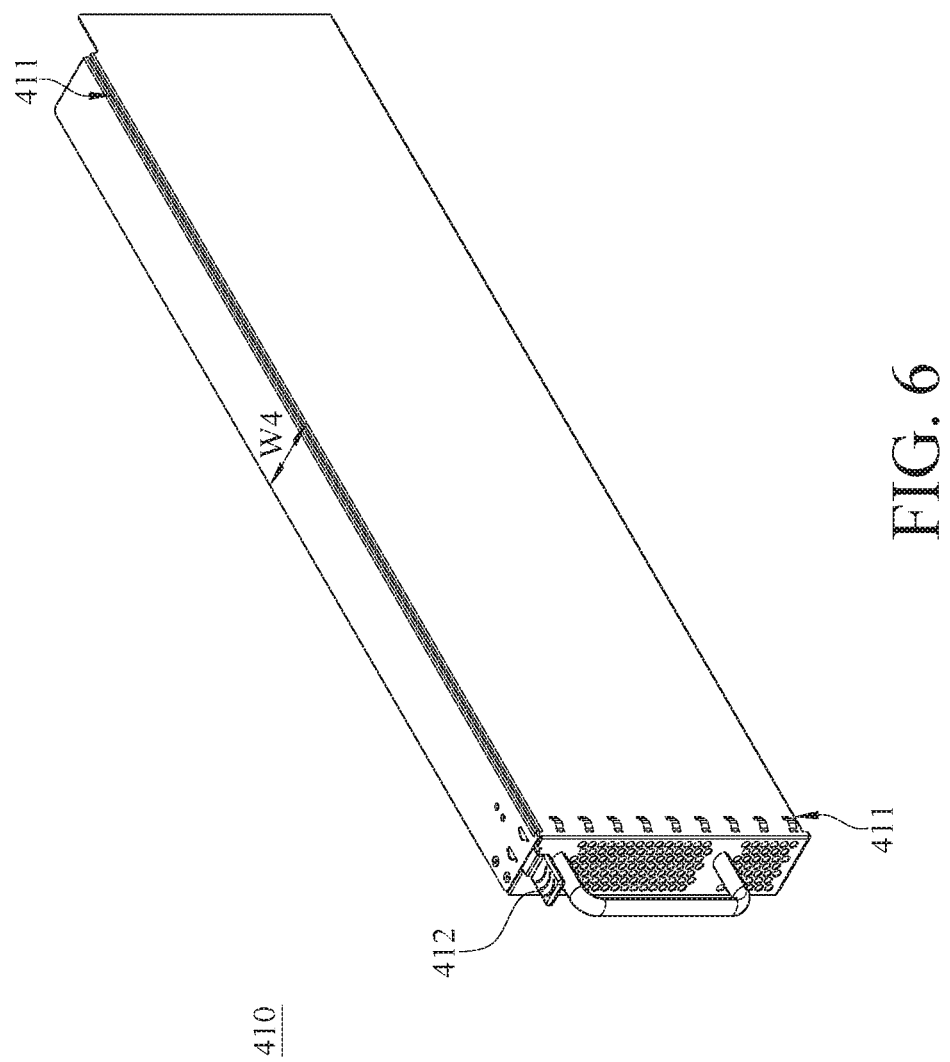
FIG. 6 is a perspective view of a first function module in FIG. 1A.
Figure 7:
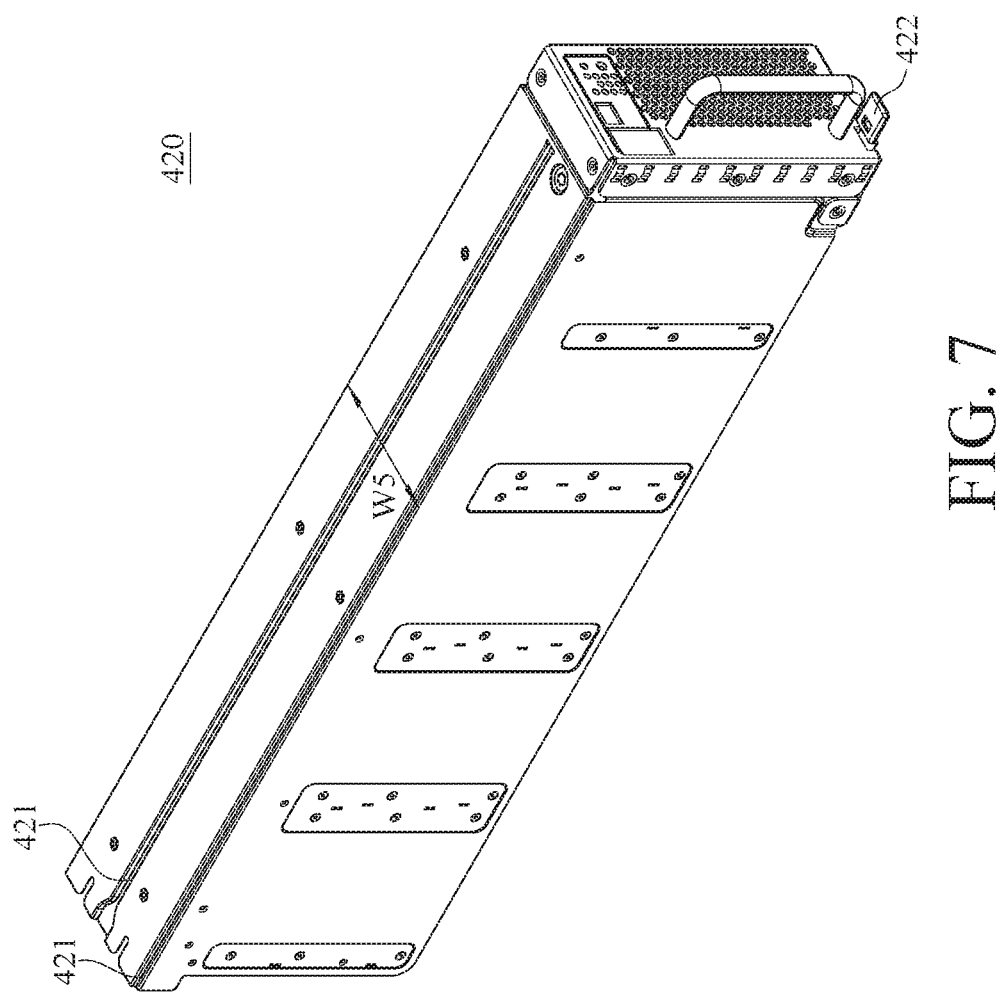
FIG. 7 is a perspective view of a second function module in FIG. 1A.
Figure 8:
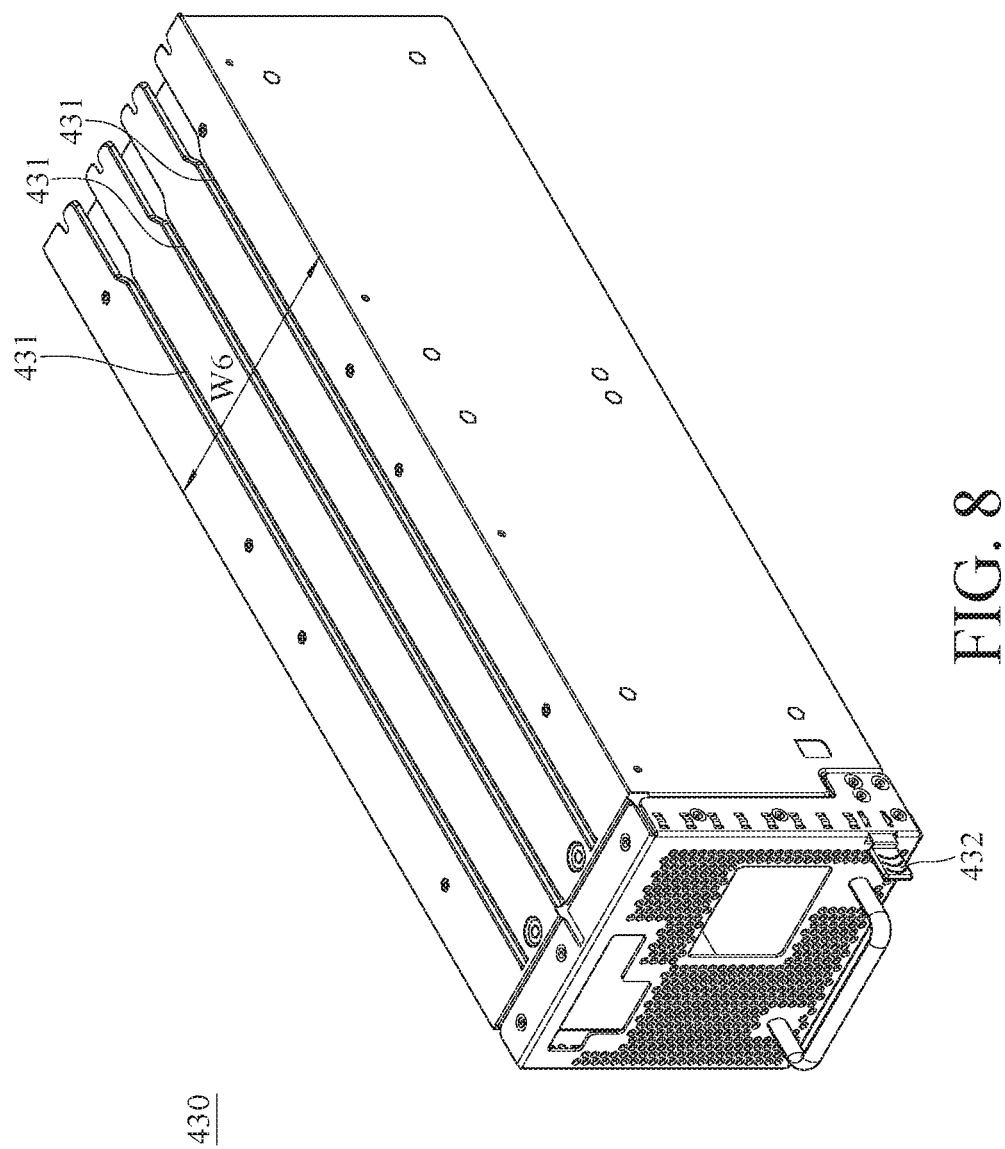
FIG. 8 is a perspective view of a third function module in FIG. 1A.

Please refer to FIG. 6 to FIG. 8. FIG. 6 is a perspective view of a first function module in FIG. 1A, FIG. 7 is a perspective view of a second function module in FIG. 1A, and FIG. 8 is a perspective view of a third function module in FIG. 1A.

Each of the function modules is able to be detachably accommodated in the respective accommodating portions S1, S2 and S3. Each of the function modules can be the first function module 410, the second function module 420 or the third function module 430. In this embodiment, the function modules are composed of two first function modules 410, two second function modules 420 and one third function module 430. A width W4 of the first function module 410 is substantially half of the width W2 of the second accommodating portion S2. In addition, the width W4 of the first function module 410, a width W5 of the second function module 420 and a width W6 of the third function module 430 have a ratio of substantially 1:2:4 (W4:W5:W6).

In this embodiment, as shown in FIG. 1A and FIG. 2, the two first function modules 410 and one of the two second function modules 420 are accommodated in the first accommodating portion S1. In the first accommodating portion S1, the second function module 420 is located between the two first function modules 410 and the first side plate 130. The other one of the two second function module 420 is accommodated in the second accommodating portion S2. The third function module 430 is accommodated in the third accommodating portion S3. In addition, the first function modules 410 are able to be detachably connected to the first connection ports 310 of the circuit board 300, respectively. The second function modules 420 and the third function module 430 are able to be detachably connected to the second connection ports 320 of the circuit board 300, respectively.

As shown in FIG. 6 to FIG. 8, the first function module 410 has a first guide groove 411. The second function module 420 has two second guide grooves 421. The third function module 430 has three third guide grooves 431. The first guide groove 411, the two second guide grooves 421 and the three third guide grooves 431 each matches each of the first guiding member 171, the second guiding member 172, the third guiding member 173, the fourth guiding member 174, the fifth guiding member 175, the sixth guiding member 176 and the seventh guiding member 177. Thus, the guiding members are able to guide the function modules to slide into the respective accommodating portions.

In addition, each of the first function modules 410 has a first fixing member 412. The first fixing member 412 of the first function modules 410 is able to detachably fix to two of the slots 121 of the top plate 120. Each of the second function modules 420 has a second fixing member 422. The second fixing member 422 of the second function module 420 is able to detachably fix to two of the slots 121 of the top plate 120. The third function module 430 has a third fixing member 432. The third fixing member 432 of the third function module 430 is able to detachably fix to the two slots 131 of the first side plate 130 or the two slots 161 of the second upright partition 160.

Please refer to FIG. 9A to FIG. 9B. FIG. 9A is a perspective view of the second function module being placed in the wrong position, and FIG. 9B is an enlarged view of the second function module in FIG. 9A.

Since the first stop protrusion 178 and the second stop protrusion 179 respectively correspond to the extension line of the second guiding member 172 and the extension line of the sixth guiding member 176, the second function module 420 is prevented from being inserted into the middle part of the first accommodating portion S1 or the middle part of the third accommodating portion S3.

When a user attempts to insert the second function module 420 into the middle part of the first accommodating portion S1, the first stop protrusion 178 stops the second function module 420 from entering the first accommodating portion S1. Similarly, when a user attempts to insert the second function module 420 into the middle part of the third accommodating portion S3, the second stop protrusion 179 stops the second function module 420 from entering the third accommodating portion S3. Thus, the second function module 420 can not be connected to the second connection ports 320 when it is attempted to insert into the middle part of the first accommodating portion S1 or the middle part of the third accommodating portion S3. Hence, by the first stop protrusion 178 and the second stop protrusion 179, the second function module 420 is prevented from being placed in the wrong position.

Figure 10:
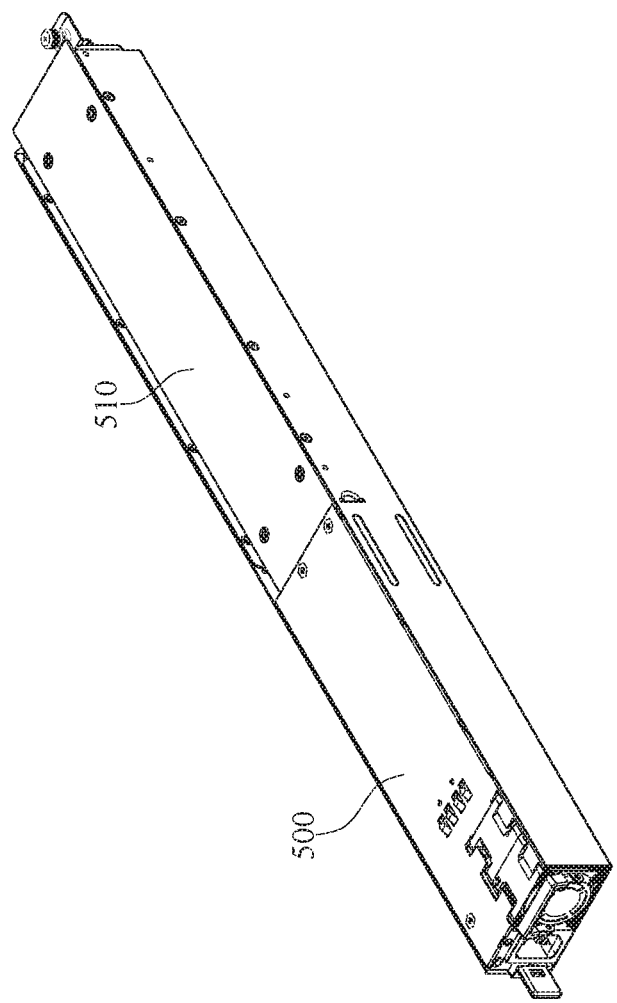
FIG. 10 is a perspective view of a power supply in FIG. 1A.

Please refer to FIG. 10 and refer back to FIG. 2. FIG. 10 is a perspective view of a power supply in FIG. 1A. In this embodiment, the server 10 further includes a plurality of power supplies 500 and a cover 600. The power supplies 500 are respectively detachably accommodated in the fourth accommodating portions S4. Each of the power supplies 500 has a second power connection port 510. The second power connection ports 510 are able to be respectively detachably fixed to the first power connection ports 330. The cover 600 covers the fifth accommodating portion S5 for preventing dust from entering the internal space S through the fifth accommodating portion S5.

In this embodiment, the function modules are composed of two first function modules 410, two second function modules 420 and one third function module 430. However, the present disclosure is not limited to the arrangement and the quantities of the function modules 410, 420 and 430. Specifically, the case 100 is flexible to accommodate 36 arrangements of function modules. In one example, each of the function modules is the first function module 410. In another example, one of the function modules is the second function module 420, and the rest of the function modules are a plurality of the first function modules 410. In still another example, one of the function modules is the third function module 430, and the rest of the function modules are a plurality of the first function modules 410. In yet another example, the function modules are composed of a plurality of the first function modules 410 and a plurality of the second function modules 420. In yet still another example, one of the function modules is the third function module 430, and the rest of the function modules are composed of a plurality of the first function modules 410 and a plurality of the second function modules 420. In yet still another example, one of the function modules is the second function module 420, one of the function modules is the third function module 430, and the rest of the function modules are a plurality of the first function modules 410. In yet still another example, two of the function modules are the third function modules 430, and the rest of the function modules are a plurality of the first function modules 410. In yet still another example, each of the function modules is the second function module 420. In yet still another example, one of the function modules is the third function module 430, and the rest of the function modules are a plurality of the second function modules 420. In yet still another example, the quantity of the function modules is three, one of the function modules is the second function module 420, and the other two of the function modules are the third function modules 430.

Figure 11:
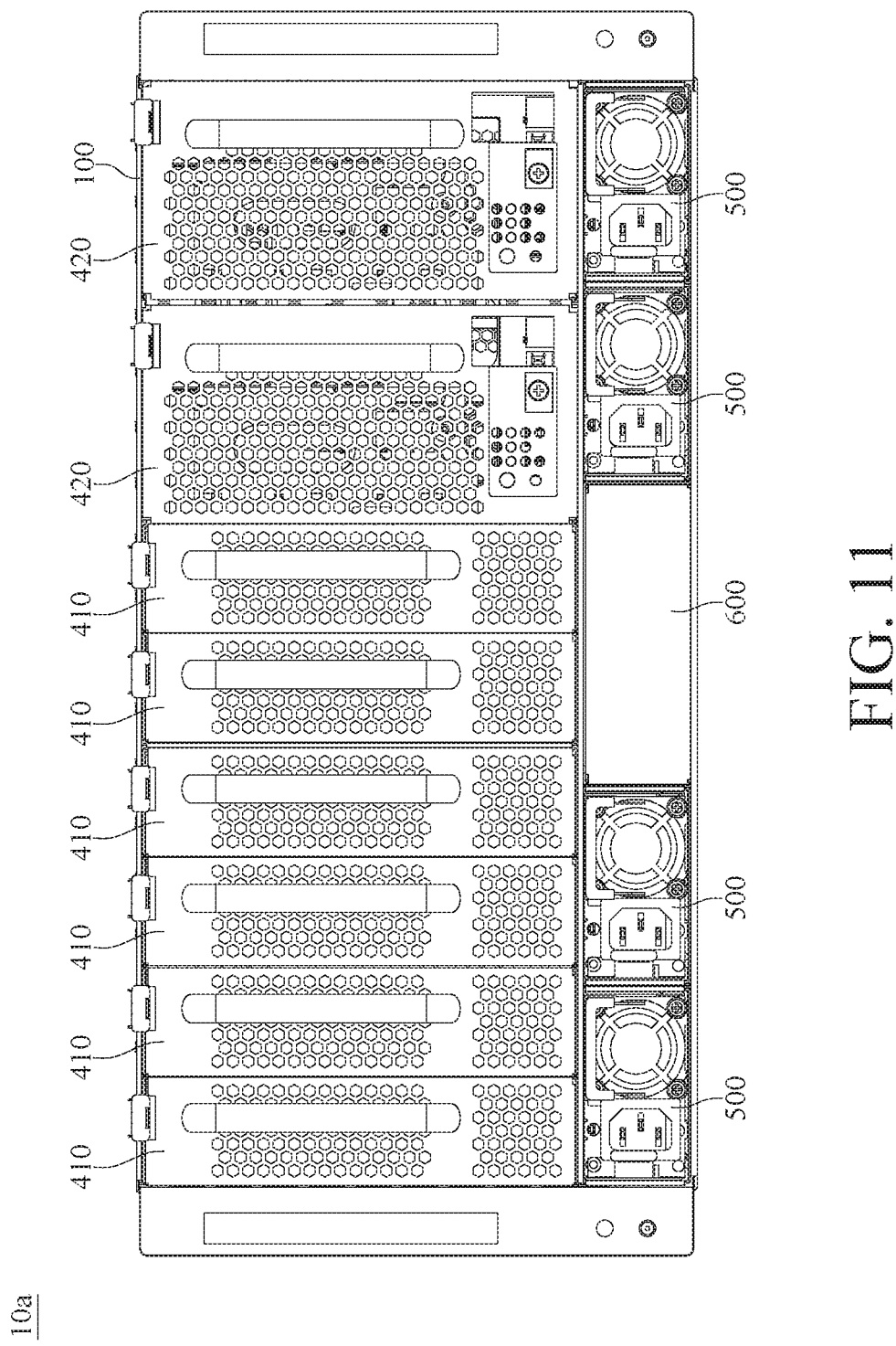
FIG. 11 is a perspective view of a server according to a second embodiment of the disclosure.
Figure 12:
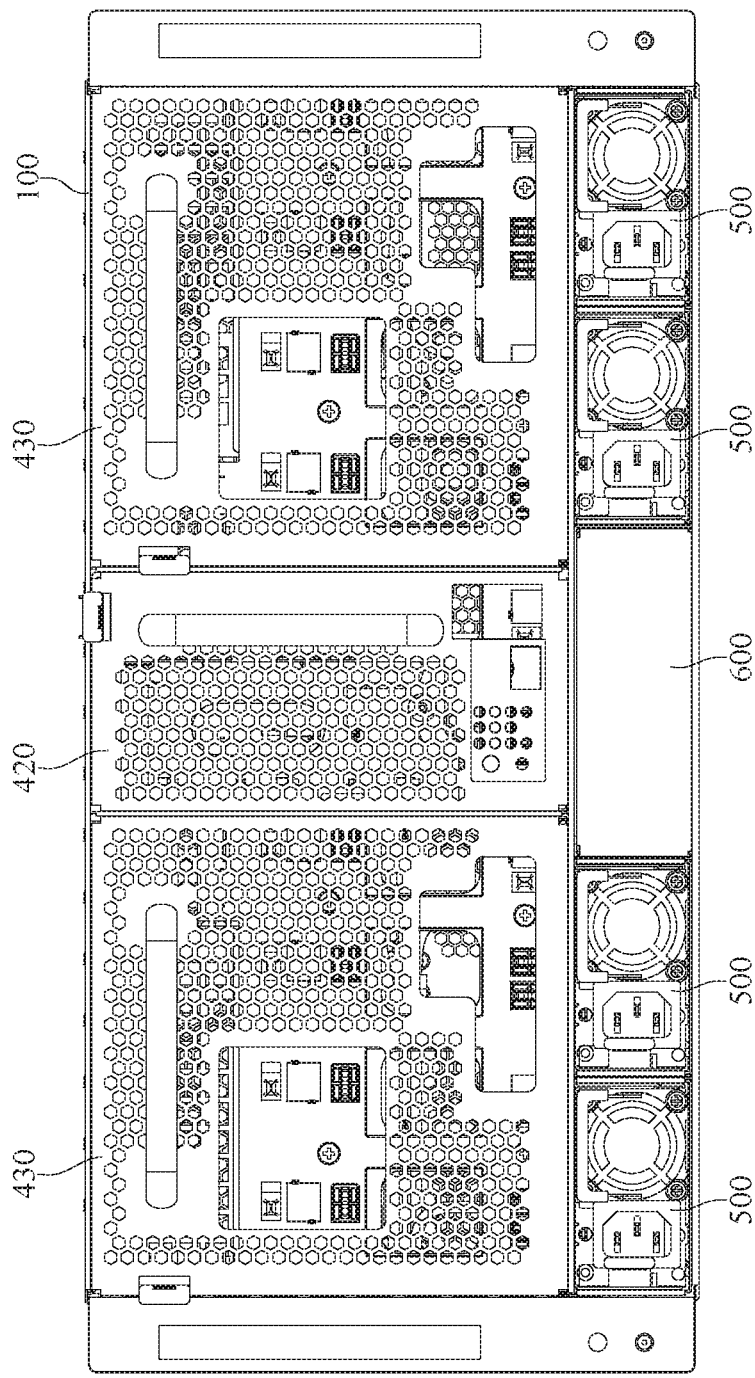
FIG. 12 is a perspective view of a server according to a third embodiment of the disclosure.

For two of the aforementioned examples, please refer to FIG. 11 to FIG. 12. FIG. 11 is a perspective view of a server according to a second embodiment of the disclosure, and FIG. 12 is a perspective view of a server according to a third embodiment of the disclosure. Since the second and the third embodiments are similar to the first embodiment, only the differences among the embodiments will be illustrated hereafter.

As shown in FIG. 11, a server 10a is provided. In the server 10a, the function modules are composed of six first function modules 410 and two second function modules 420. Four of the first function modules 410 are accommodated in the first accommodating portion S1, the rest of the first function modules 410 are accommodated in the second accommodating portion S2. The two second function modules 420 are accommodated in the third accommodating portion S3.

As shown in FIG. 12, a server 10b is provided. In the server 10b, the function modules are composed of one second function module 420 and two third function modules 430. The two third function modules 410 are respectively accommodated in the first accommodating portion S1 and the third accommodating portion S3. The second function module 420 is accommodated in the second accommodating portion S2.

According to the case and the server having the case as discussed above, since the first upright partition and the second upright partition jointly define the first accommodating portion, the second accommodating portion and the third accommodating portion in the internal space of the frame, and each of the width of the first accommodating portion and the width of the third accommodating portion is substantially twice as great as the width of the second accommodating portion, the case is flexible to accommodate 36 arrangements of function modules. Thus, the case is able to accommodate the arrangement of function modules required by the new server, so there is no need to redesign the case for the new server. Hence, the cost for developing the new server is reduced.

While this disclosure has been described in terms of several preferred embodiments, there are alterations, permutations, and equivalents, which fall within the scope of this disclosure. It should also be noted that there are many alternative ways of implementing the methods and apparatuses of the present disclosure. It is therefore intended that the following appended claims be interpreted as including all such alterations, permutations, and equivalents as fall within the true spirit and scope of the present disclosure.

What is claimed is:

1. A server, comprising:
a circuit board;
a case, comprising:
   a frame having an internal space and an opening, and the opening corresponding to the internal space; and
   a first upright partition and a second upright partition located in the internal space, the first upright partition and the second upright partition jointly defining a first accommodating portion, a second accommodating portion and a third accommodating portion in the internal space, the first accommodating portion, the second accommodating portion and the third accommodating portion corresponding to the opening, the second accommodating portion located between the first accommodating portion and the third accommodating portion, wherein each of a width of the first accommodating portion and a width of the third accommodating portion is substantially twice as great as a width of the second accommodating portion; and
a plurality of function modules respectively detachably connected to the circuit board in the first accommodating portion, the second accommodating portion and the third accommodating portion, wherein each of the plurality of function modules is a first function module, a second function module or a third function module, a width of the first function module is substantially half of the width of the second accommodating portion, and the width of the first function module, a width of the second function module and a width of the third function module have a ratio of substantially 1:2:4.

2. The server according to claim 1, wherein each of the plurality of function modules is the first function module.

3. The server according to claim 1, wherein one of the plurality of function modules is the second function module, and the rest of the plurality of function modules are a plurality of the first function modules.

4. The server according to claim 1, wherein one of the plurality of function modules is the third function module, and the rest of the plurality of function modules are a plurality of the first function modules.

5. The server according to claim 1, wherein the plurality of function modules are composed of a plurality of the first function modules and a plurality of the second function modules.

6. The server according to claim 1, wherein one of the plurality of function modules is the third function module, and the rest of the plurality of function modules are composed of a plurality of the first function modules and a plurality of the second function modules.

7. The server according to claim 1, wherein one of the plurality of function modules is the second function module, one of the plurality of function modules is the third function module, and the rest of the plurality of function modules are a plurality of the first function modules.

8. The server according to claim 1, wherein two of the plurality of function modules are the third function modules, and the rest of the plurality of function modules are a plurality of the first function modules.

9. The server according to claim 1, wherein each of the plurality of function modules is the second function module.

10. The server according to claim 1, wherein one of the plurality of function modules is the third function module, and the rest of the plurality of function modules are a plurality of the second function modules.

11. The server according to claim 1, wherein the quantity of the plurality of function modules is three, one of the function modules is the second function module, and the other two function modules are the third function modules.

12. The server according to claim 1, wherein the frame comprises a bottom plate, a top plate, a first side plate and a second side plate, the first side plate and the second side plate are located between the bottom plate and the top plate, the first side plate and the second side plate are respectively located on two sides of the bottom plate which are opposite to each other, the first upright partition and the second upright partition are located between the first side plate and the second side plate, the first upright partition is closer to the first side plate than the second upright partition, the width of the first accommodating portion is equal to a distance between the first upright partition and the first side plate, the width of the second accommodating portion is equal to a distance between the first upright partition and the second upright partition, and the width of the third accommodating portion is equal to a distance between the second upright partition and the second side plate.

13. The server according to claim 12, wherein the case further comprises a separating partition and a plurality of third upright partitions, two sides of the separating partition which are opposite to each other are respectively connected to the first side plate and the second side plate, the first upright partition and the second upright partition are located between the separating partition and the top plate, the plurality of third upright partitions are located between the separating partition and the bottom plate, the plurality of third upright partitions further define a plurality of fourth accommodating portions and a fifth accommodating portion in the internal space, and the plurality of fourth accommodating portions and the fifth accommodating portion correspond to the opening.

14. The server according to claim 13, wherein the case further comprises a first guiding member, a second guiding member, a third guiding member, a fourth guiding member, a fifth guiding member, a sixth guiding member and a seventh guiding member which protrude from the separating partition and extend away from the opening, the first through the third guiding members are sequentially arranged in the first accommodating portion in a direction away from the first side plate, the fourth guiding member is located in the second accommodating portion, the fifth through the seventh guiding members are sequentially arranged in the third accommodating portion in a direction away from the first side plate, the first function module has a first guide groove, the second function module has two second guide grooves, the third function module has three third guide grooves, the first guide groove is connectable to one of the first through the seventh guiding members, the two second guide grooves are connectable to two of the first through the seventh guiding members which are adjacent to each other, and the three third guide grooves are connectable to three of the first through the seventh guiding members which are adjacent to each other.

15. The server according to claim 14, wherein the case further comprises a first stop protrusion and a second stop protrusion, the first stop protrusion is located on an extension line of the second guiding member, and the second stop protrusion is located on an extension line of the sixth guiding member.

16. The server according to claim 13, further comprising a back plate, the back plate disposed on a side of the bottom plate away from the opening, the circuit board disposed on the back plate, a side of the circuit board close to the opening having a plurality of first connection ports and a plurality of second connection ports, wherein a distance between two of the second connection ports which are adjacent to each other is twice as great as a distance between two of the first connection ports which are adjacent to each other.

17. The server according to claim 16, further comprising a plurality of power supplies respectively detachably located in the plurality of fourth accommodating portions, the circuit board having a plurality of first power connection ports, each of the plurality of power supplies having a second power connection port, the plurality of first power connection ports respectively connected to the plurality of second power connection ports, wherein a distance between the plurality of first power connection ports and the bottom plate is greater than a distance between the bottom plate and the separating partition.

18. The server according to claim 17, wherein the back plate has a plurality of heat dissipation openings located between the first power connection ports and the bottom plate.

19. A case, comprising:
a frame having an internal space and an opening, and the opening corresponding to the internal space; and
a first upright partition and a second upright partition located in the internal space, the first upright partition and the second upright partition jointly defining a first accommodating portion, a second accommodating portion and a third accommodating portion in the internal space, the first accommodating portion, the second accommodating portion and the third accommodating portion corresponding to the opening, the second accommodating portion located between the first accommodating portion and the third accommodating portion, wherein each of a width of the first accommodating portion and a width of the third accommodating portion is substantially twice as great as a width of the second accommodating portion,
wherein the frame comprises a bottom plate, a top plate, a first side plate and a second side plate, the first side plate and the second side plate are located between the bottom plate and the top plate and respectively located on two sides of the bottom plate which are opposite to each other, the first upright partition and the second upright partition are located between the first side plate and the second side plate, the first upright partition is closer to the first side plate than the second upright partition, the width of the first accommodating portion is equal to a distance between the first upright partition and the first side plate, the width of the second accommodating portion is equal to a distance between the first upright partition and the second upright partition, and the width of the third accommodating portion is equal to a distance between the second upright partition and the second side plate, and
wherein the case further comprises a separating partition and a plurality of third upright partitions, two sides of the separating partition which are opposite to each other are respectively connected to the first side plate and the second side plate, the first upright partition and the second upright partition are located between the separating partition and the top plate, the plurality of third upright partitions are located between the separating partition and the bottom plate, the plurality of third upright partitions further define a plurality of fourth accommodating portions and a fifth accommodating portion in the internal space, and the plurality of fourth accommodating portions and the fifth accommodating portion correspond to the opening.

20. The case according to claim 19, wherein the case further comprises a first guiding member, a second guiding member, a third guiding member, a fourth guiding member, a fifth guiding member, a sixth guiding member and a seventh guiding member which protrude from the separating partition and extend away from the opening, the first through the third guiding members are sequentially arranged in the first accommodating portion in a direction away from the first side plate, the fourth guiding member is located in the second accommodating portion, the fifth through the seventh guiding members are sequentially arranged in the third accommodating portion in a direction away from the first side plate.

21. The case according to claim 20, wherein the case further comprises a first stop protrusion and a second stop protrusion, the first stop protrusion is located on an extension line of the second guiding member, and the second stop protrusion is located on an extension line of the sixth guiding member.

\* \* \* \* \*